United States Patent
Wenke et al.

(10) Patent No.: US 11,128,116 B2
(45) Date of Patent: Sep. 21, 2021

(54) ELECTRIC POWER SYSTEM PROTECTION DEVICE WITH ACTIVE AND TESTING CONFIGURATIONS

(71) Applicant: Schweitzer Engineering Laboratories, Inc., Pullman, WA (US)

(72) Inventors: Scott A. Wenke, Pullman, WA (US); Christopher John Burger, Sunbury, OH (US); David Blevins, Deary, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 227 days.

(21) Appl. No.: 16/421,832

(22) Filed: May 24, 2019

(65) Prior Publication Data

US 2020/0112160 A1 Apr. 9, 2020

Related U.S. Application Data

(60) Provisional application No. 62/742,879, filed on Oct. 8, 2018.

(51) Int. Cl.
*H02H 1/00* (2006.01)
*G01R 19/25* (2006.01)

(52) U.S. Cl.
CPC ....... *H02H 1/0061* (2013.01); *G01R 19/2513* (2013.01)

(58) Field of Classification Search
USPC ....................................................... 700/292
See application file for complete search history.

(56) References Cited

U.S. PATENT DOCUMENTS

| | | | |
|---|---|---|---|
| 7,460,590 B2 | 12/2008 | Lee | |
| 8,441,768 B2* | 5/2013 | Kasztenny | H02H 3/04 361/93.2 |
| 10,012,681 B2 | 7/2018 | Wimmer | |
| 2002/0173927 A1 | 11/2002 | Vandiver | |
| 2006/0116794 A1* | 6/2006 | Stoupis | H02J 13/00028 700/286 |
| 2008/0065270 A1* | 3/2008 | Kasztenny | H02J 13/0004 700/286 |

(Continued)

OTHER PUBLICATIONS

Calero, Fernando; Swaminathan, Rajkumar: "Testing Line Distance Relays During Their Life Cycle" Nov. 8-10, 2016.

(Continued)

*Primary Examiner* — Md Azad
(74) *Attorney, Agent, or Firm* — Bradley W. Schield; Richard M. Edge

(57) ABSTRACT

Systems for testing a protective arrangement for an electric power delivery system without disconnecting merging units from a protective device are disclosed herein. For example, an intelligent electronic device (IED) may receive, via a monitoring port, one or more operating measurements of an electrical characteristic of the power delivery system while in an operating mode. The IED may change from operating in the operating mode to operating in a test mode. In the test mode, the IED may receive, via a test port, one or more test measurements that represent measurements of the electrical characteristic. The IED may provide test results based at least in part on the one or more test measurements.

15 Claims, 6 Drawing Sheets

(56) References Cited

U.S. PATENT DOCUMENTS

| | | | |
|---|---|---|---|
| 2008/0183406 A1* | 7/2008 | Lee | G01R 19/2513 |
| | | | 702/58 |
| 2009/0070062 A1* | 3/2009 | Kirrmann | H04L 43/0817 |
| | | | 702/122 |
| 2012/0134061 A1* | 5/2012 | Kasztenny | H02H 1/0061 |
| | | | 361/64 |
| 2012/0215479 A1* | 8/2012 | Pamulaparthy | H04L 43/0864 |
| | | | 702/122 |
| 2017/0322283 A1* | 11/2017 | Schweitzer | G01R 35/04 |

OTHER PUBLICATIONS

Kazmi, Maaz; Akhtar, G.M. Asim: "Power Management and Control System—Insights Into Design and Testing" Dec. 11-13, 2018.

Yang, Qiaoyin; Keckalo, David; Dolezilek, David; Cenzon, Ed: "Testing IEC 61850 Merging Units" Oct. 17-19, 2017.

Zimmerman, Karl; Costello, David: "A Practical Approach to Line Current Differential Testing" Apr. 2013.

* cited by examiner

ELECTRIC POWER SYSTEM PROTECTION DEVICE WITH ACTIVE AND TESTING CONFIGURATIONS

RELATED APPLICATION

The present application claims the benefit under 35 U.S.C. § 119(e) of U.S. Provisional Patent Application No. 62/742,879 entitled "Electric Power System Protection Device with Front Panel Testing and Configuration", filed Oct. 8, 2018 which is herein incorporated by reference in its entirety and for all purposes.

TECHNICAL FIELD

This disclosure relates to changing configuration of an electric power system protection device. More particularly, this disclosure relates to changing between active and testing configuration of an electric power system protection device using a human-machine interface.

BRIEF DESCRIPTION OF THE DRAWINGS

Non-limiting and non-exhaustive embodiments of the disclosure are described, including various embodiments of the disclosure with reference to the figures.

DETAILED DESCRIPTION

Figure 1:
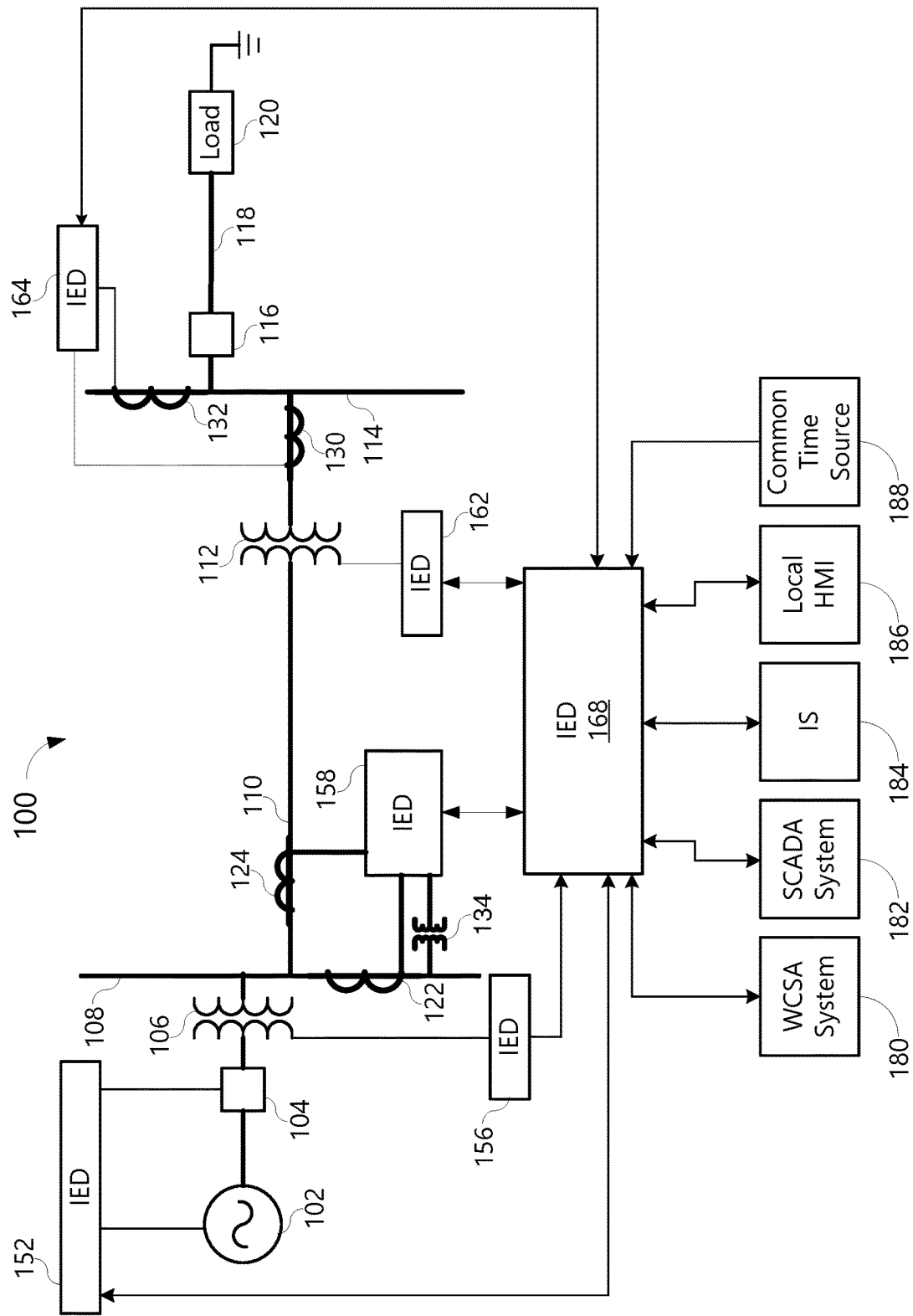
FIG. 1 illustrates a simplified one-line diagram of an electric power delivery system, in accordance with an embodiment.

Electric power delivery systems are widely used in facilitation of generation, transmission, distribution, and consumption of electric power. Such systems include a wide variety of equipment specifically designed for the purposes of electric power delivery. Such equipment is, at times, subject to conditions outside of the specified operating parameters thereof, which may result in interruption in the generation, delivery, or consumption of electric power. To mitigate against or even avoid such conditions, electric power delivery equipment and systems of equipment are often monitored using intelligent electronic devices (IEDs) that gather information from the equipment, determine operating conditions, and take an action if the determined operating conditions are outside of acceptable parameters.

For example, a three-phase electric power system may be used to carry electric power on separate conductors over distances at a high voltage. The conductors are insulated from each other and the ground. A failure of the insulation may occur for multiple reasons resulting in one conductor coming into electrical contact with another conductor or the ground. Such a failure is commonly referred as a fault. Such fault conditions may, if permitted to persist, interruptions in the power delivery system. An IED may be used to monitor power lines by obtaining electrical information from the line such as, for example, voltages and currents of the line. The IED may obtain the electrical information from one end, both ends of a line, at various locations on the system, or near pieces of equipment on the system and may operate to detect fault conditions on the line. If a fault condition is detected, the IED may command a circuit breaker to open, removing electric power from the effected portion of the system. Monitoring, detecting faults, and commanding a protective action using information from the system may use different protective elements of the IED.

IEDs may misoperate by detecting a fault condition when a fault condition does not occur, as well as by not detecting a fault when a fault is present. Indeed, the security of a protection system refers to the degree of certainty that the system will not operate incorrectly, while the dependability of a system refers to the degree of certainty that the system will operate correctly. A secure system will not detect a fault when none exists; where a dependable system will detect every fault. In order to reduce the likelihood of misoperation, protection systems that include IEDs may be tested using test sets to inject test signals into the protection system and record the response operations of the IED(s). Simulated fault conditions or near-fault conditions may be injected to determine that the system will function as expected.

As suggested above, an IED may obtain signals from disparate locations. IEDs may obtain electric power delivery system signals either directly from instrument transformers in electric communication with the power system, or using intermediate devices (such as merging units) that obtain electric power delivery system signals from the instrument transformers, sample and digitize the analog signals, and communicate the digitized analog signals to the IED. To test such a system, several testing units may be used to inject test signals into the merging units, and the merging units then perform their typical function of sampling and digitizing the test signals, and sending the digitized analog test signals to the IED. Such testing requires several testing units in communication with several merging units, which may be located at disparate locations. The testing units may be time synchronized and configured to initiate testing at a common time. Such test setups that involve synchronizing devices at disparate locations may be time consuming and/or complex. What is needed is a testing system to simplify the testing setup.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module, element, or component may, for instance, comprise one or more physical or logical blocks of computer instructions, which may be organized as a routine, program, object, component, data structure, etc., that performs one or more tasks or implements particular abstract data types.

In certain embodiments, a particular software module, element, or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates a simplified one-line diagram of an electric power delivery system 100 monitored by a number of monitoring devices in the form of intelligent electronic devices ("IEDs"). Although a simplified one-line diagram is illustrated, it is understood that the IEDs may be used to monitor a variety of different configurations of electric power delivery systems of single or multiple phases. The electric power delivery system includes a generator 102 for generating electric power at a generation voltage level, which may be transformed to a higher level by transformer 106. Circuit breaker 104 may be operable to connect and disconnect the generator from the transformer 106. The transformer 106 may be in electrical communication with a bus 108 for line 110. Transformer 112 may be used to transform the electric power from line 110 to lower levels, for distribution to loads 120 via distribution bus 114 and feeder 118. Circuit breaker 116 may be operable to connect and disconnect electric power to load 120.

As suggested above, the electric power delivery system 100 may be monitored using various IEDs. In particular, IED 152 may be configured to obtain information from generator 102, perform monitoring routines using that information, and effect an operation on the electric power delivery system 100 by signaling circuit breaker 104 to open or close, thus connecting or disconnecting generator 102 and the remainder of the electric power delivery system. IED 156 may be configured to obtain information from transformer 106, perform monitoring routines using the information, and effect an operation on the electric power delivery system via communications with other IEDs operable to signal primary equipment to perform operations on the electric power delivery system 100. IED 162 may be configured to obtain information from transformer 112, and perform monitoring routines using the information, and effect an operation on the electric power delivery system 100 via communications with other IEDs operable to signal primary equipment to perform operations on the electric power delivery system.

IED 158 may be configured to obtain information from both bus 108 and from line 110 using sensors such as, for example, current transformers (CTs) 122 and 124, potential transformers (PTs) 134, or the like. IED 158 may perform monitoring routines using the information and effect an operation on the electric power delivery system 100 via communications with other IEDs operable to signal primary equipment to perform operations on the electric power delivery system 100. Similarly, IED 164 may be configured to obtain information from both line 110 and from bus 114 using sensors such as, for example, current transformers 132 and 130, potential transformers (PTs), or the like. IED 164 may perform monitoring routines using the information and effect an operation on the electric power delivery system 100 via communications with other IEDs operable to signal primary equipment to perform operations on the electric power delivery system 100.

As illustrated, each IED is in communication with IED 168 in a star configuration. Different communication topologies may be used such as, for example, ring communication topology, direct peer-to-peer communications, and the like. IED 168 may receive information from other IEDs including, for example, information about the primary equipment, results of monitoring routines, commands for effecting an operation, and the like. IED 168 may perform system-wide monitoring routines such as, for example, differential protection of the line using information from various points on the line.

IED 168 may be in further communication with certain monitoring systems such as a wide-area control and situational awareness (WCSA) system 180, SCADA system 182, and the like. IED 168 may be in communication with an information services (IS) system 184. IED 168 may obtain a common time signal from common time source 188 such as, for example, a global navigational satellite system (GNSS) or the like. IED 168 may distribute common time to other IEDs using the time signal from the common time source 188. IED 186 may include or be in communication with a local human-machine interface (HMI) 186.

Certain of the IEDs may be physically located in the same substation. For example, the generator 102, circuit breaker 104, transformer 106, and bus 108 may be co-located at a single site, and IEDs 152, 156, and 158 may be housed in a single substation. Whereas other of the IEDs may be located at different sites and different substations.

Although the IEDs as illustrated are in direct communication with primary equipment, in various embodiments, IEDs may obtain information from primary equipment using a sampling device such as, for example, a merging unit. Specifically, a merging unit may be in communication with the primary equipment to obtain signals therefrom and provide the information from those signals (such as digitized signals) to one or more IEDs. For example, a merging unit may be in communication with CT 124 for receiving the secondary current signal from CT 124, sample the secondary current signal, digitize the secondary current signal, and communicate the digitized signal to subscribing IEDs.

Figure 2:
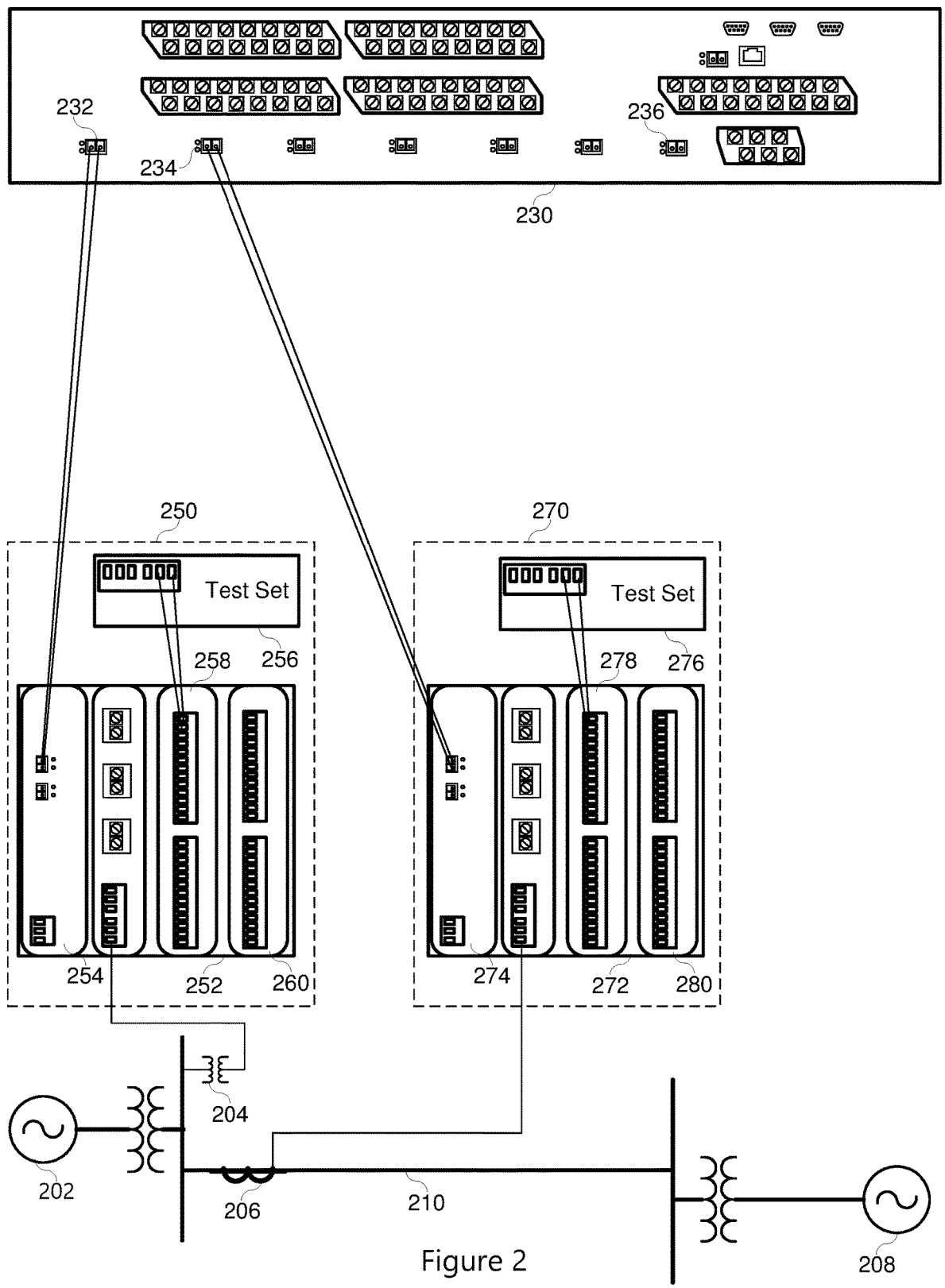
FIG. 2 illustrates a simplified block diagram of an electric power system protection device in communication with merging units for obtaining electric power system signals from the electric power system and testing the system in a first test configuration, in accordance with an embodiment.

FIG. 2 illustrates a simplified block diagram of a system for protection of an electric power delivery system in a first test configuration. Specifically, illustrated is a simplified one-line diagram of an electric power delivery system that includes generation 202 and 208 at different ends of a transmission line 210. Instrument transformers 204 and 206 are at different locations on the electric power delivery system may provide power system signals to merging units 250 and 270, respectively. The instrument transformers may be CTs as illustrated, PTs for providing voltage signals, capacitively coupled voltage transformer (CCVTs) for providing voltage signals, Rogowski coils for providing current signals, and the like.

Merging unit 252 may be located in a first CT/PT cabinet 250 near the instrument transformer(s) 204 for obtaining electric power delivery system signals from a first location, sampling and digitizing the signals, and communicating the digitized signals to IED 230. The merging unit 252 may include various input and/or output modules 258 and 260 to obtain signals. As illustrated, input module 260 is in electrical communication with instrument transformer 204. Module 254 is in communication with the IED 230 to send digitized signals to the IED and receive communications from the IED.

Similarly, merging unit 272 may be located in a second CT/PT cabinet 270 near the instrument transformer(s) 206 for obtaining electric power delivery system signals from a second location, sampling and digitizing the signals, and communicating the digitized signals to IED 230. The merging unit 272 may include various input and/or output modules 278 and 280 to obtain signals. As illustrated, input module 280 is in electrical communication with instrument transformer 206. Module 274 is in communication with the IED 230 to send digitized signals to the IED and receive communications from the IED 230.

In normal operation, the merging units 252 and 272 obtain electric power system signals from a first location and a second location using instrument transformers 204, 206. The merging units 252 and 272 sample and digitize the electric power system signals and communicate the signals to IED 230. The IED 230 may perform monitoring and protection functions such as differential protection of the electric power delivery system using the power system signals from the first location and from the second location. Upon detection of a fault, the IED 230 may send a command to one or both of the merging units 250 and 270 to perform a protective function such as opening a circuit breaker.

Testing of the protective system may be performed using a first test set 256 co-located at the first CT/PT cabinet 250 with the merging unit 252, and a second test set 276 co-located at the second CT/PT cabinet 270 with the merging unit 272. The test sets 256 and 276 may be in communication with the merging units 252 and 272 to provide test signals to the merging units 252 and 272. The merging units 252 and 272 sample and digitize the test signals and provide the digitized signals to the IED 230. The IED then performs monitoring and protective functions using the communicated test signals and provides an output to be tested for proper operation.

In the embodiment illustrated in FIG. 2, there may be separate test sets 256 and 276 located at different locations (CT/PT cabinets 250, 270). To supply proper signals for proper testing, the test sets 256 and 276 may be time synchronized, and separately initiated at the same instant for application of the test signals. Furthermore, the test sets 256 and 276 may be transported to the CT/PT cabinets 250 and 270, installed, connected to the merging units, and so forth. The merging units 252 and 272 may also be reconfigured such that the test signals are sampled and communicated, and the actual power system signals are not communicated to the IED 230. Such operations are time consuming and offer substantial opportunity for mistakes.

Figure 3:
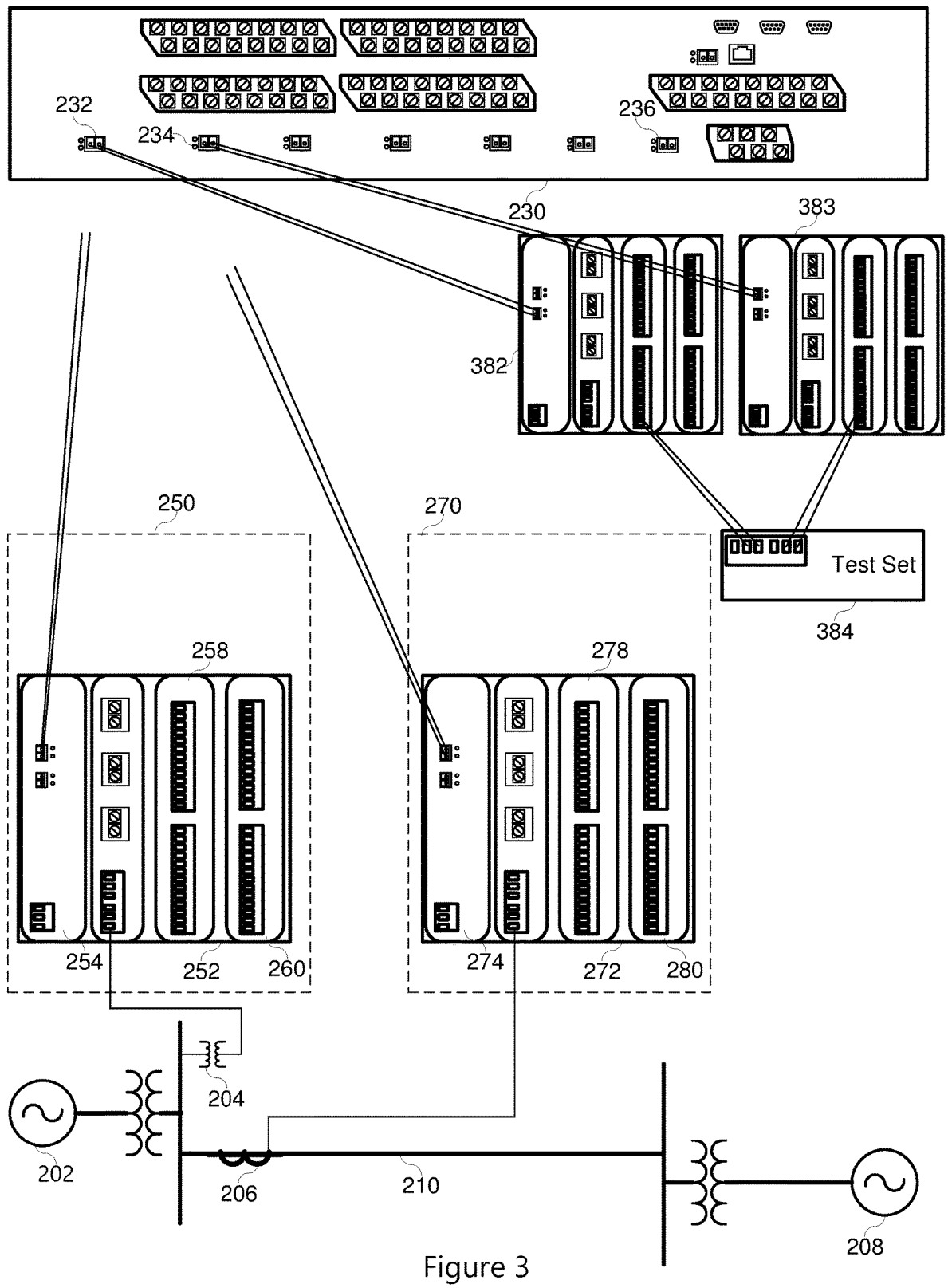
FIG. 3 illustrates a simplified block diagram of an electric power system protection device in communication with merging units for obtaining electric power system signals from the electric power system and testing the system in a second test configuration, in accordance with an embodiment.

FIG. 3 illustrates a block diagram of another testing system for an electric power delivery protection system in a second test configuration. According to the illustrated embodiment, a test set 384 supplies test signals to one or more testing devices, such as a first test merging unit 382 and a second test merging unit 383. The first test merging unit 382 and the second test merging unit 383 may be configured to sample the test signals from the test set 384, digitize the signals and communicate the digitized test signals to the IED 230. For proper operation, the merging units 252 and 272 may first be disconnected from the IED 230 by removing the communication media from the merging units 252 and 272 from the communication ports 232 and 234. Once communications from the merging units 252 and 272 have been removed from the IED 230, communication media from the test merging unit 382 may be connected to the same ports 232 and 234 of the IED 230. Thus, the IED 230 receives the digitized test signal communications in the same manner as it would have received the actual power system signals. Specifically, the IED 230 may be configured to receive electric power system signals from the first location originating from instrument transformer 204 via communication port 232; and receive electric power system signals from the second location originating from instrument transformer 206 via communication port 234. To properly test the IED 230, therefore, the test signals emulating the actual power system signals should be supplied to the IED 230 via the same communication ports from which the IED 230 is configured to receive the actual power system signals.

According to the system illustrated in FIG. 3, once the communication media from merging units 252 and 272 have been removed from ports 232 and 234, and communication media from the first test merging unit 382 and the second test merging unit 383 have been connected to respective ports 232 and 234, the digitized test signals are applied to the IED 230 for testing. One or more test sets 384 and test merging units 382 and 383 may be used to supply the test signals to the IED via ports 232 and 234. For example, the first test merging unit 382 may send digitized test signals to the ports 232 emulating power system signals that were obtained from the first merging unit 252, and the second test merging unit 383 may send digitized test signals to the ports 234 emulating power system signals that were obtained from the second merging unit 272.

The one or more test sets and one or more test merging units may be located at the same location and/or at the same location as the IED 230. In the illustrated embodiment, the test set 384 may send signals emulating electrical characteristics of the first location and send signals emulating electrical characteristics of the second location to allow the test merging units to be at the same location as each other and/or the IED 230. By locating the testing merging units and the IED at the same location, the connection/disconnection of communication media and other setup during testing may be simplified.

Figure 4:
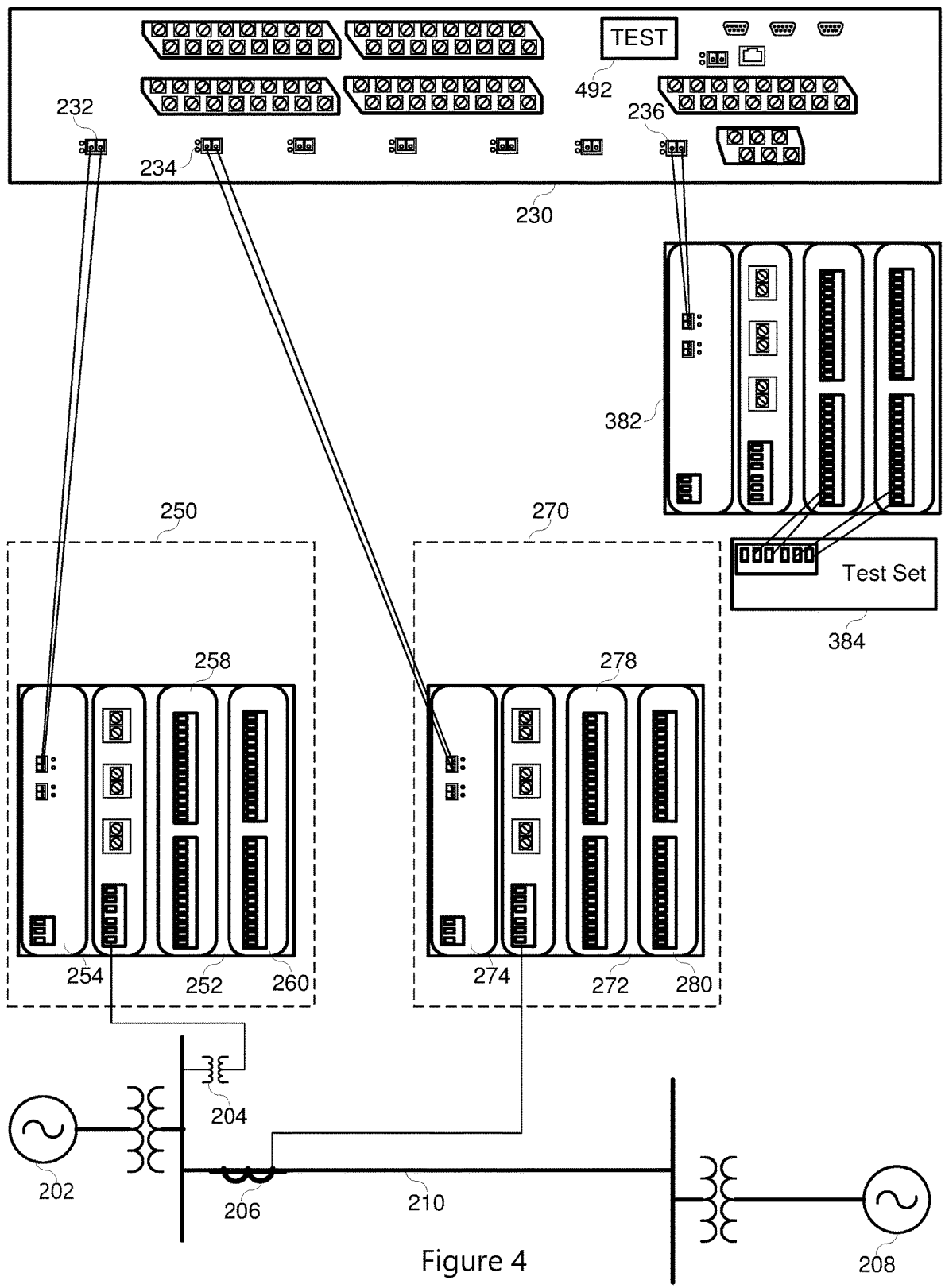
FIG. 4 illustrates a simplified block diagram of an electric power system protection device in communication with merging units for obtaining electric power system signals from the electric power system and testing the system in a third test configuration, in accordance with an embodiment.

FIG. 4 illustrates a block diagram of another testing system for testing an electric power delivery protection system in a third testing configuration, in accordance with an embodiment. One or more test sets 384 may be in communication with a test merging unit 382. The test merging unit 382 is in communication with a test communication port 236 of the IED. Digitized test signals may be applied to the IED 230 via the test communication port 236 without disconnection of media from merging units 252 and 272 from ports 232 and 234 and reconnection of test signal media to ports 232 and 234.

In the illustrated embodiment, the IED may change configurations from an operational mode to a test mode before initiation of the test signals to the IED 230. For such reconfiguration, the IED 230 may include a mechanism for reconfiguring the IED 230 from the operational mode to the testing mode. In the illustrated embodiment, the IED 230 includes a physical input 492 in the form of a push button that, when activated (e.g., depressed), causes the IED 230 to reconfigure from operational mode to testing mode. Other mechanisms for reconfiguration may be used. For example, the IED 230 may include a human-machine interface (HMI) with an option for reconfiguration between operational mode and testing mode. In one embodiment, the testing mode button 492 may be on the back face of the IED 230. In another embodiment, the testing mode button 492 may be on a front panel of the IED 230. In some embodiments, the test communications port 236 and the testing mode button 492 may be on the same face of the IED 230; such as the back face of the IED 230 or the front face of the IED 230. In various embodiments, the initiation of the test mode may be performed using a command issued from the IED 230.

Reconfiguration of the IED 230 may be a reconfiguration of the communication sources and may not have any effect or change to the monitoring or protective functions of the IED 230. That is, upon entering the test mode, the IED 230 may reconfigure communications such that communications received on the communications ports 232 and 234 except for the test communication port are not processed; and communications on the communications port 236 are processed. The reconfiguration may be performed in the settings of the IED 230. It may be performed by logically disconnecting all communication ports except for the test communications port 236 from processing. Accordingly, the monitoring and protection routines operate normally using quantities supplied by the test set 384 via the test merging unit 382. The origin of the quantities does not affect the operation of the monitoring and protection routines of the IED 230. A user will issue a test command that puts the IED 230 in test mode; while the IED is in test mode, the IED switches from a commissioned topology (merging unit 252 and 272 with connections to instrument transformers 204 and 206) to a test topology (merging unit 382 with connections to Test set 384).

In certain embodiments, the test set 384 and test merging unit 382 may be a single device operable to provide digitized test signals to the IED 230. In other embodiments, multiple test sets may be used to supply test signals to a single test merging unit 382. The test merging unit 382 may be similar or even identical in function to the merging units 252 and 272 used to obtain power system signals from the instrument transformers.

Figure 5:
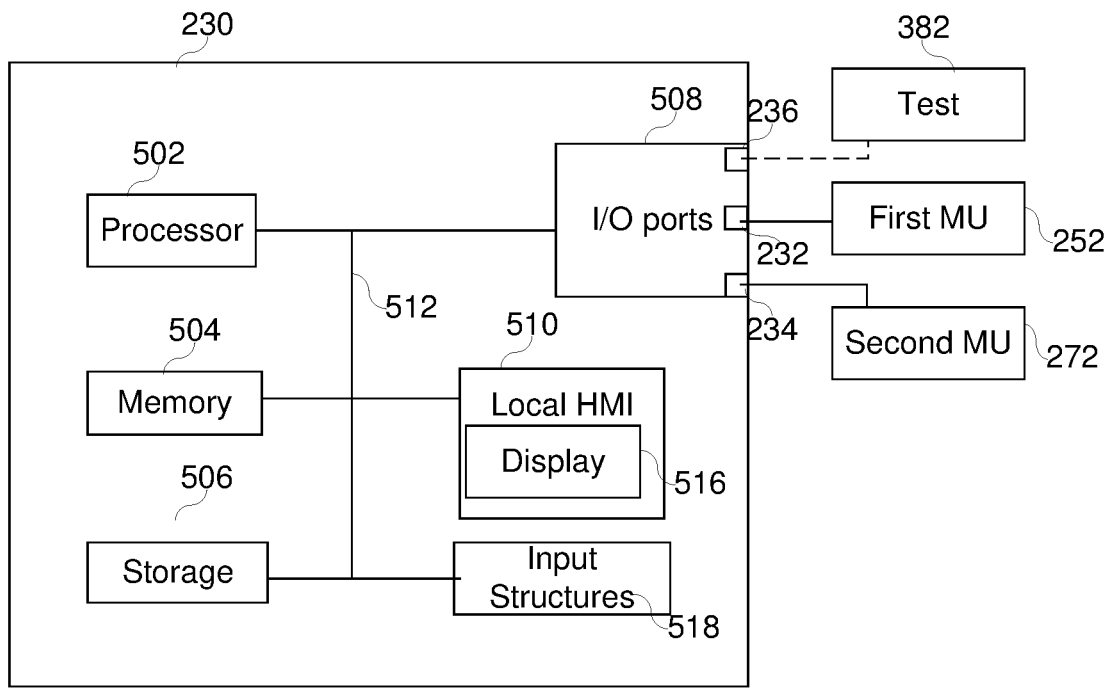
FIG. 5 illustrates a block diagram of an electric power system protection device in the third test configuration of FIG. 4, in accordance with an embodiment.

FIG. 5 is a block diagram of the IED 230 in the third configuration that uses a test port to simplify the testing setup. The IED 230 may include one or more processor(s) 502, memory 504, nonvolatile storage 506, I/O ports 508, and a local HMI 510, and input structures 518. The various functional blocks shown in FIG. 5 may include hardware elements (including circuitry), software elements (including computer code stored on a computer-readable medium) or a combination of both hardware and software elements. It should be noted that FIG. 5 shows one example of a particular implementation and is intended to illustrate the types of components that may be present in the IED 230. The processor 502 may be a single contained processing module or may be incorporated wholly or partially within any of the other elements within the IED 230.

The processor 502 may be operably coupled, via one or more communication buses 512, with the memory 504 and the nonvolatile storage 506 to perform various algorithms. Such programs or instructions executed by the processor 502 may be stored in any suitable article of manufacture that includes one or more tangible, computer-readable media at least collectively storing the instructions or routines, such as the memory 504 and the nonvolatile storage 506.

The memory 504 and the nonvolatile storage 506 may include any suitable articles of manufacture for storing data and executable instructions, as described above. In some embodiments, the nonvolatile storage 506 and/or the processor 502 may be implemented as hardware components, such as via discrete electrical components, via a field programmable gate array (FPGA), and/or via one or more application specific integrated circuits (ASICs) and may be referred to generally as processing circuitry. Further, the instructions or routines may be provided to the processor 502 to produce a machine, such that the instructions, when executed by the processor 502, implement the operations/acts specified in the flowchart described below with respect to FIG. 6.

The local HMI 510 may include a display screen 516 that allows a user to view information on the IED 230, such as a liquid crystal display (LCD), organic light emitting diode (OLED) display, or the like. Further, the IED 230 may include input structures 518, such as the test mode button 492, that enable the user to interact with the IED 230. In some embodiments, the display 516 and input structures 518 may be embodied as a touchscreen display.

The I/O ports 508 may include a first monitoring port 232 operably connected to a first merging unit 252 and a second monitoring port 234 operably connected to a second merging unit 272 to communicate with the IED 230, as described above. For example, the merging unit 252 may send digitized electric power signals indicating electrical measurements of the electric power delivery system. For instance, the merging units 252 and 272 may provide voltage measurements or current measurements.

Figure 6:
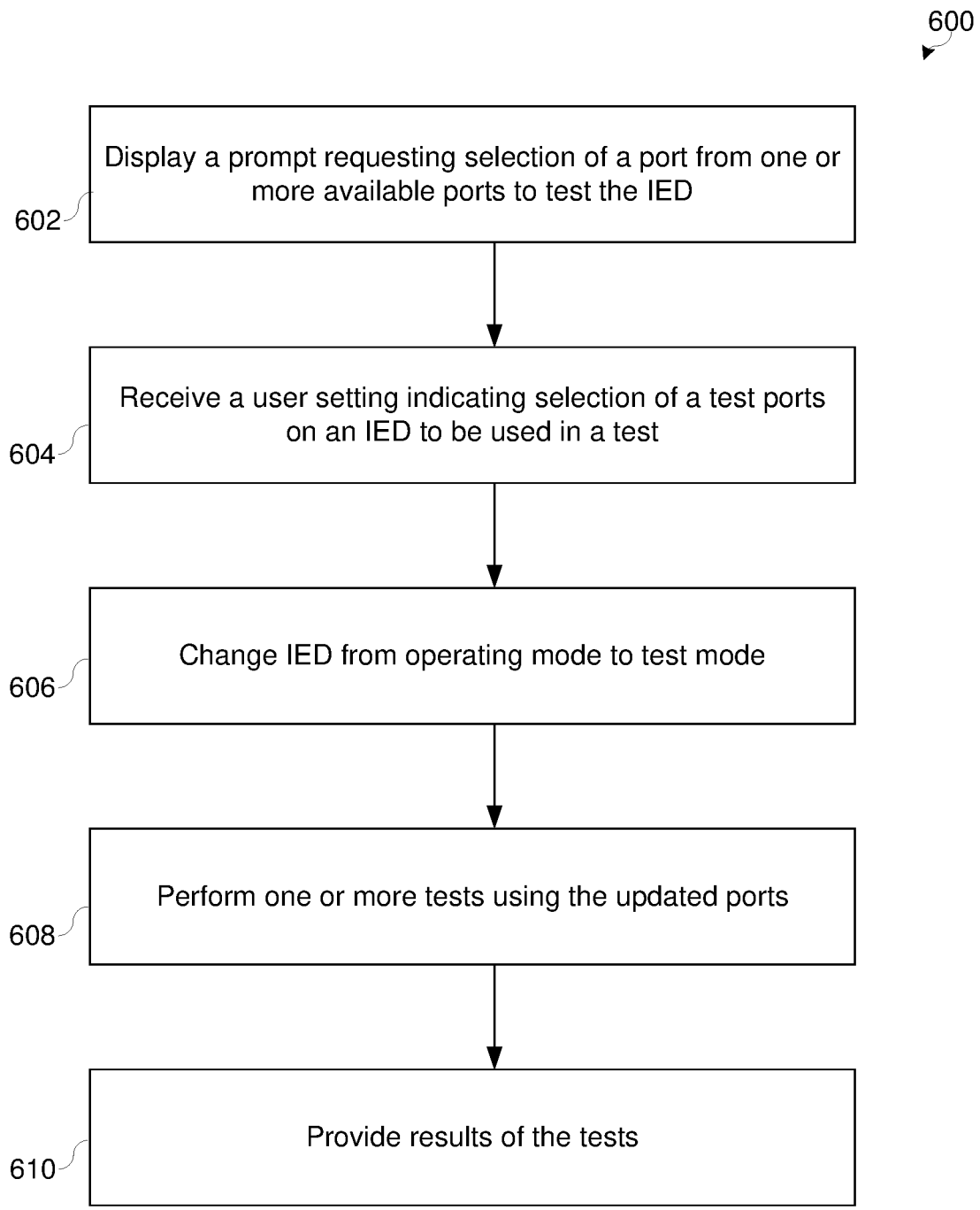
FIG. 6 illustrates a flow chart of a process to test the electric power system protection device in the third test configuration of FIG. 4, in accordance with an embodiment.

FIG. 6 is a flow chart of a process 600 that may be performed by the processor 502 to test the IED 230 in the third testing configuration of FIG. 5 to simplify the testing process. The process 600 may be stored as instructions (e.g., code) in the memory 504 and/or nonvolatile storage 506 and executed by the processor 502 to perform the steps described herein. The process 600 may be performed while the IED 230 is in operation. That is, the first monitoring port 232 and the second monitoring port 234 may be connected to the first merging unit 252 and the second merging unit 272, respectively, and the IED 230 may be actively monitoring the electrical power delivery system. For instance, the IED 230 may be receiving first operating measurements of a first electrical characteristic (e.g., voltage at a first location of potential transformer 204) from the first merging unit 252 and receiving second operating measurements of a second electrical characteristic (e.g., current at a second location of current transformer 206) from the second merging unit 272.

The processor 502 may send a signal to the display screen 516 to cause the display screen 516 to provide a prompt requesting a test port to be used to test the IED 230 (block 602). In some embodiments, the display screen 516 may display a list of available ports to be used to test the IED. The processor 502 may receive a user setting indicating a selection of the test port 534 from the available ports (block 604). Further, the user may select a test port 534 and connect the test merging unit 382 to the testing port 534 to communicatively couple the test merging unit 382 to the IED 230. As mentioned above, in other embodiments, a physical test mode button may be used to receive inputs from the user. The processor 502 may then receive an input to switch to the test mode on the local HMI 510.

The processor 502 may then change (e.g., reconfigure) the IED 230 from an operating mode in which the IED 230 receives signals from the first merging unit 232 and the second merging unit 272 to a test mode in which the IED 230 receives signals from a test device (block 606). To change to the test mode, the processor 502 may reconfigure a topology of the IED 230 from receiving first digital signal(s) via the first monitoring port 232 and second digital signal(s) via the second monitoring port 234 to receiving a third digital signal(s) via the test port 534. The first digital signal(s) may indicate first operating measurements (e.g., voltages of a first location) from the electric power delivery system and the second digital signal(s) may indicate second operating measurements (e.g., current of a second location) from the electric power delivery system. The third digital signal(s) may include signals that indicate first test measurements representative of measurements sent by the first merging unit 252 and signals that indicate second test measurements representative of measurements sent by the second merging unit 272.

The processor 502 may perform a test based on one or more test measurements using the test port (block 608). For example, the testing device 336 may provide a first test measurement as if the measurement were from the first merging unit by indicating in the digital message addressing information associated with the first merging unit. Further, the testing device 336 may provide a second test measurement as if the measurement were from the second merging unit by including addressing information in the digital message associated with the second merging unit.

As an example of a test, the IED 230 may receive a first test signal representative of the measurement from the first merging unit 252 that indicate an event at a first time. The IED may receive a second test signal representative of measurements from the second merging unit 272 that indicate the event at a second time. The processor 502 may detect the event has occurred and determine a location of the event based upon a difference between the first time and the second time. While this is given as an example of a test, any suitable testing may be performed on the IED 230.

In the illustrated embodiment, the IED 230 may receive one or more test signals over a single test port that indicates test measurements representative of measurements from both the first merging unit 252 and the second merging unit 272. That is, testing setup may be further simplified by communicating test messages from more than one merging unit over the same test port. In other embodiments, the IED 230 may receive a first digital signal from a first test port and a second digital signal from a second test port.

The processor 502 may then provide the results of the test on the display screen 516 to allow an operator to assess the IED 230. In the example above, depending on the time difference between the first test signal and the second test signal, the processor 502 may provide a distance to a fault from a merging unit. While this is provided as an example test, any suitable tests may be performed via in the testing environment. In certain embodiments, the IED 230 may send a signal to the test merging unit 382 indicating a command to open a circuit breaker as if the command were sent to the first merging unit or the second merging unit. That is, the IED 230 may perform protection operations as if the communications were with the first merging unit 252 and the second merging unit 272. The testing device may receive these protection operation signals and may output to a display on the testing device the test results without affecting circuit breakers of the first merging unit 252 and the second merging unit 272.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. An intelligent electronic device (IED) configured to monitor an electric power delivery system, comprising:
   a first monitoring port;
   a second monitoring port;
   a test port;
   memory; and
   a processor operatively coupled to the memory, wherein the processor is configured to:
      while the IED is in an operating mode, receive, via the first monitoring port, a first digital signal indicating one or more first operating measurements of a first electrical characteristic of the electric power delivery system;
      while the IED is in the operating mode, receive, via the second monitoring port, a second digital signal indicating one or more second operating measurements of a second electrical characteristic of the electric power delivery system;
      change the IED from the operating mode to a test mode;
      while the IED is in the test mode, receive, via the test port, a third digital signal indicating both one or more first test measurements and one or more second test measurements, wherein the one or more first test measurements represent measurements of the first electrical characteristic as if the first test measurements were received via the first monitoring port, wherein the one or more second test measurements represent measurements of the second electrical characteristic as if the second test measurements were received via the second monitoring port, wherein receiving the third digital signal via the test port allows an operator to obtain test results without affecting the first monitoring port configuration, the second monitoring port configuration, or both; and provide a test result based at least in part on the one or more test measurements.

2. The IED of claim 1, wherein the processor is configured to change the IED to the test mode without disconnecting a first merging unit from the first monitoring port and the second merging unit from the second monitoring port.

3. The IED of claim 1, wherein the processor is configured to change configuration of the IED from a first topology in which the IED receives signals from a first device while the first device is communicatively coupled to the electric power delivery system to a second topology in which the IED receives signals from a second device that is not communicatively coupled to the power delivery system.

4. The IED of claim 3, wherein communicatively coupled comprises an electrical coupling, a magnetic coupling, or both.

5. The IED of claim 1, wherein the processor is configured to:

provide, via a display of the IED, a prompt requesting a selection from a list of available ports to be used as the test port of the IED; and receive the selection of the test port from the list of available ports.

6. The IED of claim 1, comprising a test mode button, wherein the IED changes from the operating mode to the test mode upon activation of the test mode button.

7. The IED of claim 1, wherein the test mode button control and the test port are positioned on the same panel.

8. A non-transitory, computer readable medium comprising instructions configured to be executed by a processor of an intelligent electronic device (IED) to cause the processor to:

while the IED is in an operating mode, receive a first digital signal indicating one or more first operating measurements of a first electrical characteristic via a first monitoring port;

while the IED is in the operating mode, receive a second digital signal indicating one or more second operating measurements of a second electrical characteristic via a second monitoring port change the IED from the operating mode to a test mode;

while the IED is in the test mode, receive a third digital signal indicating one or more first test measurements and one or more second test measurements via a test port, wherein the one or more first test measurements represent measurements of the first electrical characteristic as if the one or more first test measurements were received via the first monitoring port and the one or more second test measurements represent measurements of the second electrical characteristic as if the one or more second test measurements were received via the second monitoring port, wherein receiving the third digital signal via the test port allows an operator to obtain test results without affecting configuration of the first monitoring port, the second monitoring port, or both; and provide a test result based at least in part on the one or more test measurements.

9. The non-transitory, computer readable medium of claim 8, wherein the instructions are configured to be executed by the processor to cause the processor to provide test results via a display of the IED.

10. The non-transitory, computer readable medium of claim 8, wherein the instructions are configured to be executed by the processor to cause the processor to change configuration of the IED from a first topology in which the IED receives signals from a first device while the first device is communicatively coupled to the electric power delivery system to a second topology in which the IED receives signals from a second device that is not communicatively coupled to the power delivery system.

11. The non-transitory, computer readable medium of claim 8, wherein the instructions are configured to be executed by the processor to cause the processor to:

detect a fault during the test using the one or more test measurements;

determine a distance to the fault based at least in part on the one or more test measurements; and provide, via a display of the IED, the distance to the fault to allow an operator to compare the distance with expected results of the test.

12. The non-transitory, computer readable medium of claim 8, wherein the instructions are configured to be executed by the processor to cause the processor to swap the first monitoring port with the test port in protection operations of the IED.

13. A method, comprising:

connecting a testing device to an IED via a test port of the IED; and changing the IED from operating in an operating mode in which the IED receives, via a first monitoring port, a first digital signal to monitor one a first electrical characteristic of a power delivery system and receives, via a second monitoring port, a second digital signal to monitor a second electrical characteristic of the power delivery system to operating in a test mode in which the IED receives, via a test port, a third digital signal indicating one or more test electrical measurements representing measurements of the first electrical characteristic and the second electrical characteristic to allow testing of the IED from the test port as if the one or more test electrical measurements were received via the first monitoring port and the second monitoring port to allow an operator to obtain test results without affecting the first monitoring port configuration, the second monitoring port configuration, or both.

14. The method of claim 13, comprising:

inputting, into the IED, a selection of a test port from a list of available ports; and performing a test using the selection of the test port.

15. The method of claim 13, comprising changing the IED from operating in the operating mode to operating in the test mode via depression of a test mode button.

* * * * *